(12) United States Patent
Sato et al.

(10) Patent No.: US 9,954,198 B2
(45) Date of Patent: Apr. 24, 2018

(54) DISPLAY DEVICE

(71) Applicant: Japan Display Inc., Tokyo (JP)

(72) Inventors: Toshihiro Sato, Tokyo (JP); Tetsuya Nagata, Tokyo (JP); Tohru Sasaki, Tokyo (JP)

(73) Assignee: Japan Display Inc., Tokyo (JP)

( * ) Notice: Subject to any disclaimer, the term of this patent is extended or adjusted under 35 U.S.C. 154(b) by 0 days.

(21) Appl. No.: 15/136,430

(22) Filed: Apr. 22, 2016

(65) Prior Publication Data

US 2016/0240814 A1 Aug. 18, 2016

Related U.S. Application Data

(63) Continuation of application No. 14/071,949, filed on Nov. 5, 2013, now Pat. No. 9,349,985.

(30) Foreign Application Priority Data

Nov. 20, 2012 (JP) .................................. 2012-254120

(51) Int. Cl.
  *H01L 51/52* (2006.01)
  *H01L 27/32* (2006.01)
  (Continued)

(52) U.S. Cl.
  CPC ........ *H01L 51/5246* (2013.01); *G02F 1/1339* (2013.01); *H01L 27/15* (2013.01);
  (Continued)

(58) Field of Classification Search
  CPC ... H01L 51/5246; H01L 51/52; H01L 51/524; H01L 51/525; H01L 51/5237;
  (Continued)

(56) References Cited

U.S. PATENT DOCUMENTS 6,839,122 B2 * 1/2005 Chung ................. G02F 1/1339
                                                    349/153
7,724,341 B2 * 5/2010 Kondo ................. G02F 1/1339
                                                    349/153
(Continued)

FOREIGN PATENT DOCUMENTS

CN         101373786 A       2/2009
CN         103137896 A       6/2013
(Continued)

OTHER PUBLICATIONS

Chinese Office Action dated Nov. 7, 2016 for corresponding Chinese Application No. 201310587447.9 with partial translation.
(Continued)

*Primary Examiner* — Johannes P Mondt
(74) *Attorney, Agent, or Firm* — Typha IP LLC

(57) ABSTRACT

A display device includes a circuit substrate that is formed of a plurality of layers including a light control element; a counter substrate that faces a surface of the circuit substrate on which the light control element is disposed, with a gap therebetween; a seal that is disposed between the circuit substrate and the counter substrate to surround the light control element; and a filler with which a sealed space surrounded by at least the circuit substrate, the counter substrate, and a sealing surface of the seal is filled. The sealing surface includes internal angle corner surfaces formed by an inner surface of the seal, and a convex surface formed adjacent to the corner surfaces from at least one of the circuit substrate, the counter substrate, and the seal.

5 Claims, 14 Drawing Sheets

(51) Int. Cl.
  *H01L 27/15* (2006.01)
  *G02F 1/1339* (2006.01)
(52) U.S. Cl.
  CPC .......... *H01L 27/3244* (2013.01); *H01L 51/52* (2013.01); *H01L 51/525* (2013.01); *H01L 27/322* (2013.01); *H01L 27/3276* (2013.01)
(58) Field of Classification Search
  CPC ... H01L 27/15; H01L 27/3244; H01L 27/322; H01L 27/3276; G02F 1/1339
  USPC ...... 257/40, 88–93, 100; 313/292, 481, 500, 313/509, 512; 349/153, 155
  See application file for complete search history.

(56) References Cited

U.S. PATENT DOCUMENTS

| | | | |
|---|---|---|---|
| 2002/0196393 A1* | 12/2002 | Tashiro | G02F 1/1303 349/106 |
| 2004/0004434 A1 | 1/2004 | Nishi et al. | |
| 2005/0078267 A1* | 4/2005 | Motomatsu | G02F 1/1339 349/190 |
| 2007/0172971 A1 | 7/2007 | Boroson | |
| 2008/0151172 A1 | 6/2008 | Kondo et al. | |
| 2010/0302492 A1 | 12/2010 | Kubota et al. | |
| 2012/0154732 A1 | 6/2012 | Morita | |
| 2012/0194772 A1 | 8/2012 | Moriwaki | |

FOREIGN PATENT DOCUMENTS

| | | |
|---|---|---|
| JP | 2005302740 A | 10/2005 |
| JP | 2007233117 A | 9/2007 |
| JP | 2012-074238 A | 4/2012 |
| JP | 2013-137998 A | 7/2013 |

OTHER PUBLICATIONS

Chinese Patent Office Action dated Nov. 30, 2015 corresponding to Chinese Patent Application No. 201301587447.9.

Japanese Office Action dated Jul. 26, 2016, for corresponding Japanese Patent Application No. 2012-254120 and Partial Translation thereof.

* cited by examiner

DISPLAY DEVICE

CROSS-REFERENCE TO RELATED APPLICATION

The present application is a continuation application of U.S. patent application Ser. No. 14/071,949, filed on Nov. 5, 2013. Further, this application claims priority from Japanese application JP2012-254120 filed on Nov. 20, 2012, the contents of which are hereby incorporated by reference into this application.

BACKGROUND OF THE INVENTION

1. Field of the Invention

The present invention relates to a display device.

2. Description of the Related Art

A display device has a structure in which an element that controls a light is sandwiched between a pair of substrates. For example, in an organic electroluminescence display device, a counter substrate is stuck onto a TFT (thin film transistor) substrate so as to face an OLED (organic light-emitting diode) element portion disposed on the TFT substrate. In this structure, in order to ensure the reliability of the OLED element portion formed on the TFT substrate, a sealing film made of SiN or the like is formed on the OLED element, and further for the purpose of reducing a loss of light caused by internal reflection, the counter substrate is stuck onto the TFT substrate through a filler.

It is general that drops of the filler are put inside of a convex dam disposed in a periphery of the TFT substrate so as not to protrude outside the dam. In this situation, it is difficult to completely fill an inside of the dam structure with the filler without any space, and a problem that air bubbles remain arises. If the air bubbles enter a display area, a display of an image is affected by the air bubbles. JP 2007-233117 A and JP 2005-302740 A disclose a measure against the air bubbles in the filler.

JP 2007-233117 A discloses that a protrusion is formed with the use of a film stacked on the TFT substrate, to thereby prevent the air bubbles from being involved in the filler. However, since the protrusion is formed by the stacked film, a height of the protrusion is limited, resulting in such a problem that the effect of the protrusion is small.

JP 2005-302740 A has proposed a structure in which a convex portion corresponding to the dam is not continuously formed, but divided in corner portions to provide gaps, and the filler is intentionally protruded outside. However, since the protrusion of the filler causes a process of removing the protruded filler to increase, this structure is not practical.

SUMMARY OF THE INVENTION

An object of the present invention is to reduce an influence of air bubbles remaining in a sealing space filled with a filler on display of an image.

(1) According to the present invention, there is provided a display device, including: a circuit substrate that is formed of a plurality of layers including a light control element; a counter substrate that faces a surface of the circuit substrate on which the light control element is disposed, with a gap therebetween; a seal that is disposed between the circuit substrate and the counter substrate to surround the light control element; and a filler with which a sealed space surrounded by at least the circuit substrate, the counter substrate, and a sealing surface of the seal is filled, in which the sealing surface includes internal angle corner surfaces formed by an inner surface of the seal, and a convex surface formed adjacent to the corner surfaces from at least one of the circuit substrate, the counter substrate, and the seal. According to the present invention, the air bubbles contained inside of the filler are collected inside of the corner surfaces because of a property that the air bubbles are stable in a state where the air bubbles come in contact with the sealing surface. Since an inside of the corner surfaces is formed with a plurality of compartment areas by the convex surface, the air bubbles are dispersed in the respective compartment areas. As a result, even if the air bubbles remain in the sealed space, the air bubbles can be reduced, and an influence of the air bubbles on the display of an image can be reduced.

(2) In the display device as described in the item (1), the convex surface is formed of the inner surface of the seal, and protrudes and projects from the corner surfaces in an inward direction of the sealed space with a height extending from the circuit substrate to the counter substrate, and the seal is entirely continuously integrally formed with the inclusion of the convex surface.

(3) In the display device as described in the item (2), a width between the inner surface and an outer surface of the seal is wider in the convex surface.

(4) In the display device as described in the item (2), the seal has a concave surface in the outer surface in correspondence with the convex surface formed in the inner surface.

(5) In the display device as described in the item (4), the seal is extended along a line having a start point and an end point coincident with each other, and drawn without any interruption and without passing through the same line twice or more.

(6) In the display device as described in the item (1), a surface of the circuit substrate is irregularly formed due to a difference in the stacked layers, and the convex surface is formed adjacent to a relatively low surface of the surface of the circuit substrate.

(7) In the display device as described in the item (6), the convex surface is spaced from the counter substrate, and a space between the convex surface and the counter substrate is a part of the sealed space.

(8) In the display device as described in the item (6) or (7), the circuit substrate includes an uppermost layer, and a metal layer covered with the uppermost layer, and the convex surface is formed in a portion that covers the metal layer of the uppermost layer.

(9) In the display device as described in the item (8), the metal layer is arranged to pass through a position overlapping with the seal.

(10) In the display device as described in the item (1), the convex surface is formed on the counter substrate.

(11) In the display device as described in the item (10), the counter substrate includes: a color filter layer that is arranged with the avoidance of an area inside of the corner surfaces; and a spacer that is disposed at a position overlapping with the color filter layer, and the convex surface is formed of a layer made of the same material as that of the spacer, which is disposed in the area inside of the corner surfaces.

(12) In the display device as described in the item (11), the convex surface formed by the spacer is spaced from the circuit substrate, and the space between the convex surface and the circuit substrate is a part of the sealing surface.

DETAILED DESCRIPTION OF THE INVENTION

Hereinafter, embodiments of the present invention will be described with reference to the accompanying drawings.

First Embodiment

Figure 1:
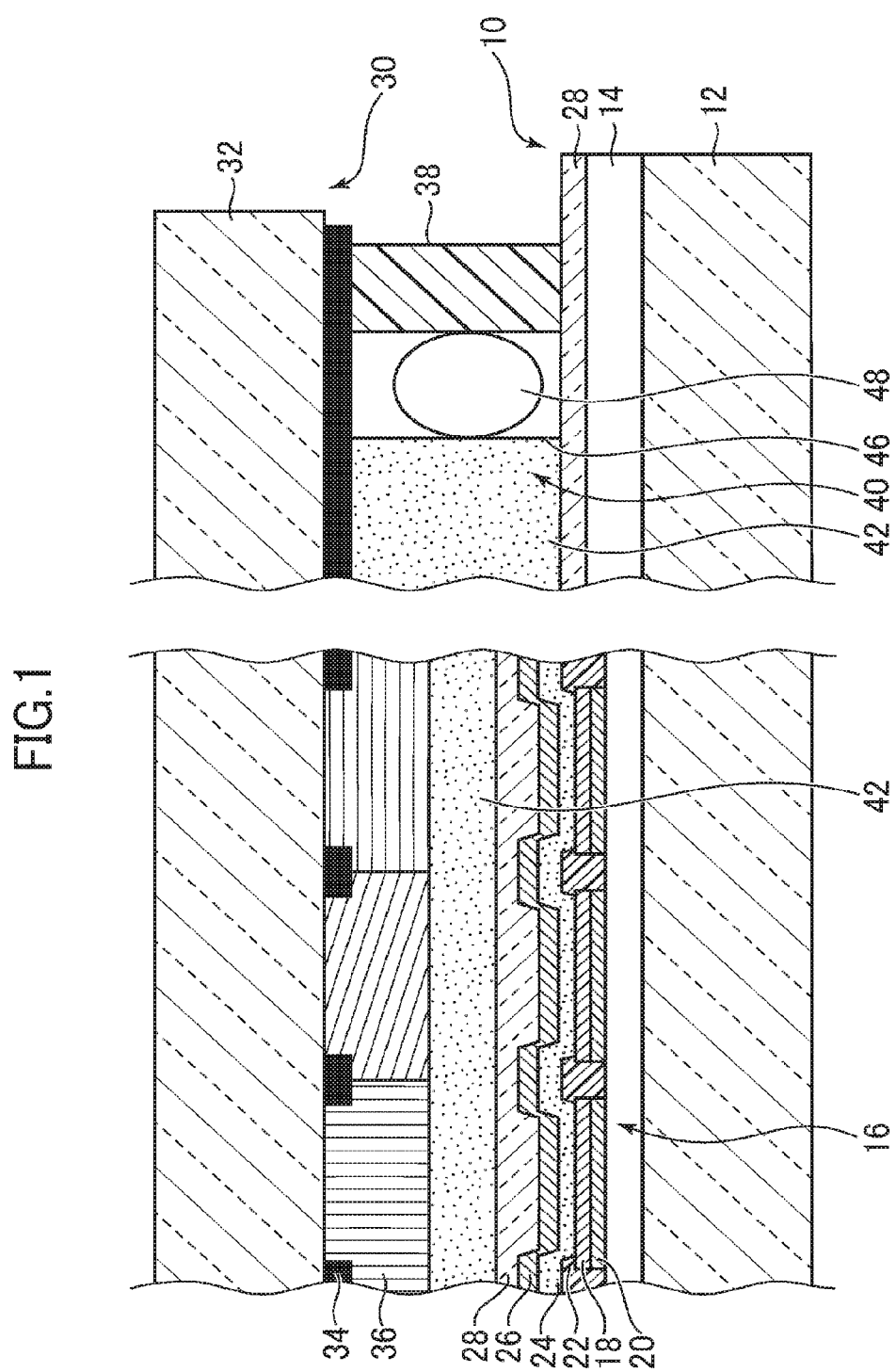
FIG. 1 is a cross-sectional view taken along a line I-I of a display device illustrated in FIG. 2.

FIG. 1 is a cross-sectional view illustrating a display device according to a first embodiment of the present invention. The display device is directed to an organic electroluminescence display device in this embodiment, but may be a liquid crystal display device or the other display devices. The display device can be used in a television receiver, a personal computer monitor, a notebook computer, a PDA (personal digital assistant), a cellular phone, a digital still camera, a digital video camera, and a car navigation monitor.

The display device has a circuit substrate 10. The circuit substrate 10 includes a plurality of layers. One of the plural layers is a first substrate 12 made of glass or the like. The first substrate 12 is formed with a circuit layer 14 including circuits such as thin film transistors not shown. A light control element 16 is formed of at least one layer of the plural layers.

The light control element 16 is an organic electroluminescence element in this embodiment. Lower electrodes 18 (for example, anodes as pixel electrodes) are formed to be connected to source electrodes (or drain electrodes) of thin film transistors not shown. Reflecting layers 20 that reflect a light are formed below the lower electrodes 18. Bank layers 22 made of insulator are formed to expose a part of the lower electrodes 18. An organic electroluminescence layer 24 is formed to contact with the lower electrodes 18 in openings of the bank layers 22. The organic electroluminescence layer 24 includes at least a light emitting layer, and has, for example, a known structure in which a hole injected layer, a hole transport layer, a light emitting layer, an electron transport layer, and an electron injection layer are stacked in order from the lower electrodes 18. An upper electrode 26 (for example, a cathode as a common electrode) is formed on the organic electroluminescence layer 24. The upper electrode 26 is covered with a seal film 28. The seal film 28 is made of, for example, an inorganic material (for example, SiN, SiO, SiON). Also, the seal film 28 may be formed by stacking an inorganic material and an organic material on each other. In the display device of FIG. 1, a light emitted from the circuit substrate 10 is monochromatic. For that reason, the organic electroluminescence layer 24 is formed in an image display area as a series of films.

The display device has a counter substrate 30. The counter substrate 30 is spaced from the circuit substrate 10, and faces a surface of the circuit substrate 10 on which the light control element 16 is disposed. In this embodiment, the counter substrate 30 has a plurality of layers. A first layer of the plural layers is a second substrate 32 made of glass or the like. The second substrate 32 is formed with a black matrix layer 34. Also, the second substrate 32 is formed with color filter layers 36. A part of the color filter layers 36 is placed on the black matrix layer 34. Since the color filter layers 36 are used, in this example, the organic electroluminescence layer 24 emits a white light.

Figure 2:
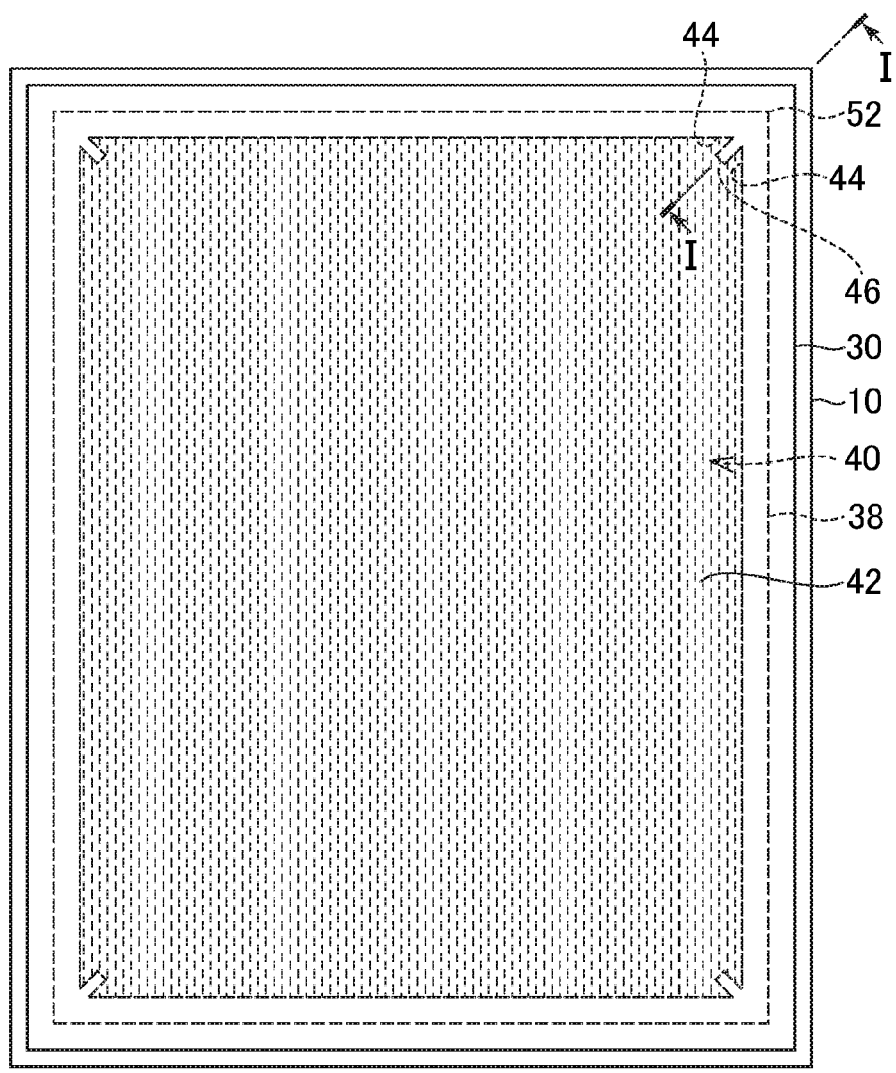
FIG. 2 is a plan view illustrating the display device according to a first embodiment of the present invention.

FIG. 2 is a plan view illustrating the display device according to the first embodiment of the present invention. FIG. 1 is a cross-sectional view taken along a line I-I of the display device illustrated in FIG. 2. A seal 38 is disposed between the circuit substrate 10 and the counter substrate 30 so as to surround the light control element 16. A space is sealed with the seal 38. In detail, a sealed space 40 is surrounded by a sealing surface including at least the circuit substrate 10, the counter substrate 30, and the seal 38. The sealed space 40 is filled with a filter 42. The filter 42 is made of, for example, a transparent resin.

Figure 3:
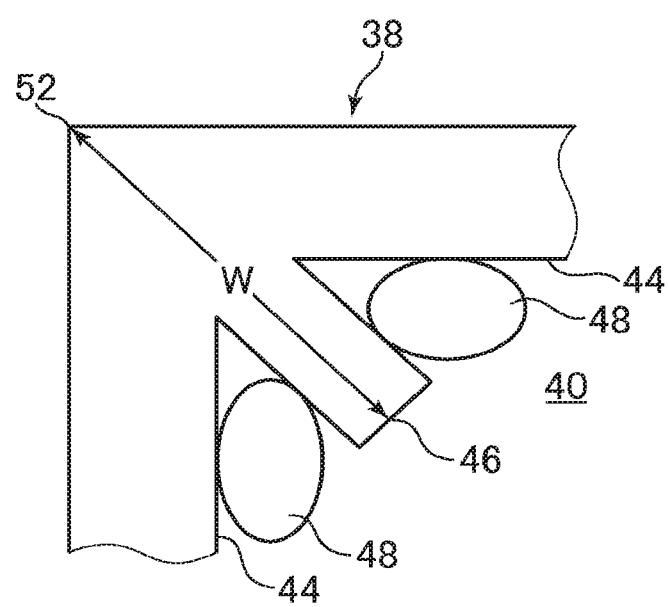
FIG. 3 is an enlarged view illustrating a corner portion of a seal illustrated in FIG. 2.

FIG. 3 is an enlarged view of a corner portion of the seal 38 illustrated in FIG. 2. Each of convex surfaces 46 is formed from an inner surface of the seal 38, and configured by a surface forming a protrusion in which a part of the seal 38 is protruded toward the sealed space 40 side. The seal 38 is entirely continuously integrally formed with the inclusion of the convex surface 46. A width W between an inner surface and an outer surface of the seal 38 is wider in a portion where the convex surface 46 is formed.

The sealing surface includes internal angle corner surfaces 44. The internal angle corner surfaces 44 is formed by the inner surface of the seal 38. The sealing surface includes the convex surface 46. The convex surface 46 is formed adjacent to the corner surfaces 44 from at least one (only the seal 38 in this embodiment) of the circuit substrate 10, the counter substrate 30, and the seal 38. The convex surface 46 is protruded from the corner surfaces 44 in an inward direction of the sealed space 40 with a height extended from the circuit substrate 10 to the counter substrate 30 as illustrated in FIG. 1. The sealed space 40 is divided into a plurality of partition areas by the convex surfaces 46 inside of the corner surfaces 44. The filter 42 can provide air bubbles 48 in each of the plural partition areas.

According to this embodiment, the air bubbles 48 are collected inside of the corner surfaces 44 because of a property that the air bubbles are stable in a state where the air bubbles come in contact with the sealing surface. Since the inside of the corner surfaces 44 is formed with the plurality of partition areas by the convex surfaces 46, the air bubbles 48 are dispersed in the respective partition areas. As a result, if the air bubbles 48 are generated, the air bubbles 48 can be reduced in size, and an influence of the air bubbles 48 on the display of the image can be reduced. Also, the filter 42 is cured after sealing so that the movement of the air bubbles 48 can be prevented.

Figure 4:
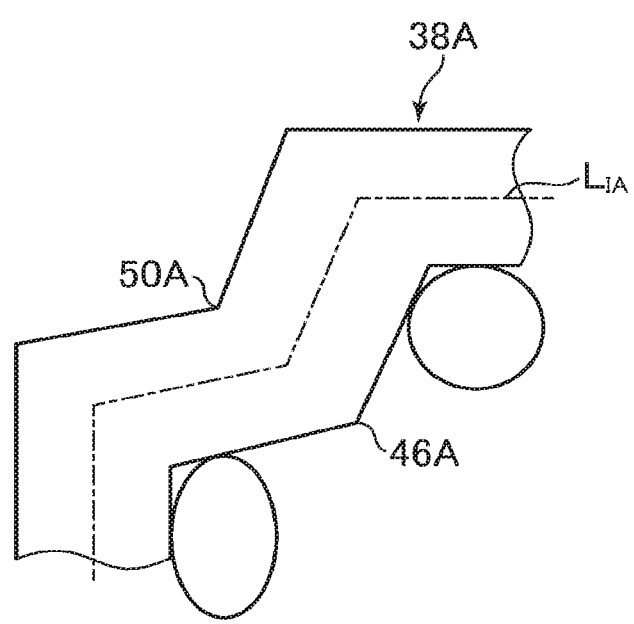
FIG. 4 is an enlarged view illustrating one modified example of the seal illustrated in FIG. 3.

FIG. 4 is a diagram illustrating one modified example of the seal 38 illustrated in FIG. 3. In this example, a seal 38A has a concave surface 50A in an outer surface thereof in correspondence with a convex surface 46A formed in an inner surface thereof. The seal 38A is extended along a line $L_{1A}$ having a start point and an end point coincident with each other, and drawn without any interruption and without passing through the same line twice or more. The line $L_{1A}$ along which the seal 38A is extended is bent at an obtuse angle.

Figure 5:
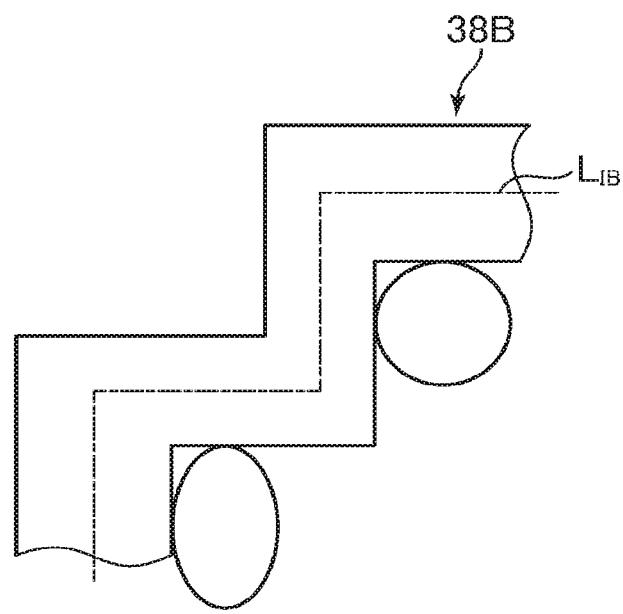
FIG. 5 is an enlarged view illustrating a modified example of the seal illustrated in FIG. 4.

FIG. 5 is a diagram illustrating a modified example of the seal 38 illustrated in FIG. 4. This example is different from the example illustrated in FIG. 4 in that a line $L_{1B}$ along which a seal 38B is extended is bent at a right angle.

Figure 6:
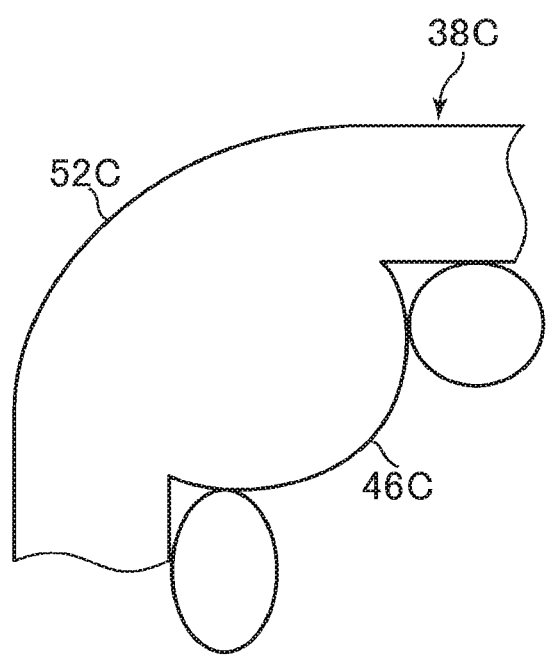
FIG. 6 is an enlarged view illustrating another modified example of the seal illustrated in FIG. 3.

FIG. 6 is a diagram illustrating another modified example of the seal 38 illustrated in FIG. 3. In the example illustrated in FIG. 3, the convex surface 46 is shaped by three side surfaces of a square pole. On the other hand, in the example illustrated in FIG. 6, a convex surface 46C is formed by a convex curved surface formed of apart of a side surface of a column. Also, in the example illustrated in FIG. 3, an outer surface of the seal 38 has a convex portion 52 formed by two side surfaces of a triangle pole in an outer surface opposite to the convex surface 46. On the other hand, in the example illustrated in FIG. 6, an outer surface of the seal 38C has a convex portion 52C formed of a part of the side surface of the column in an outer surface opposite to the convex surface 46C.

Second Embodiment

Figure 7:
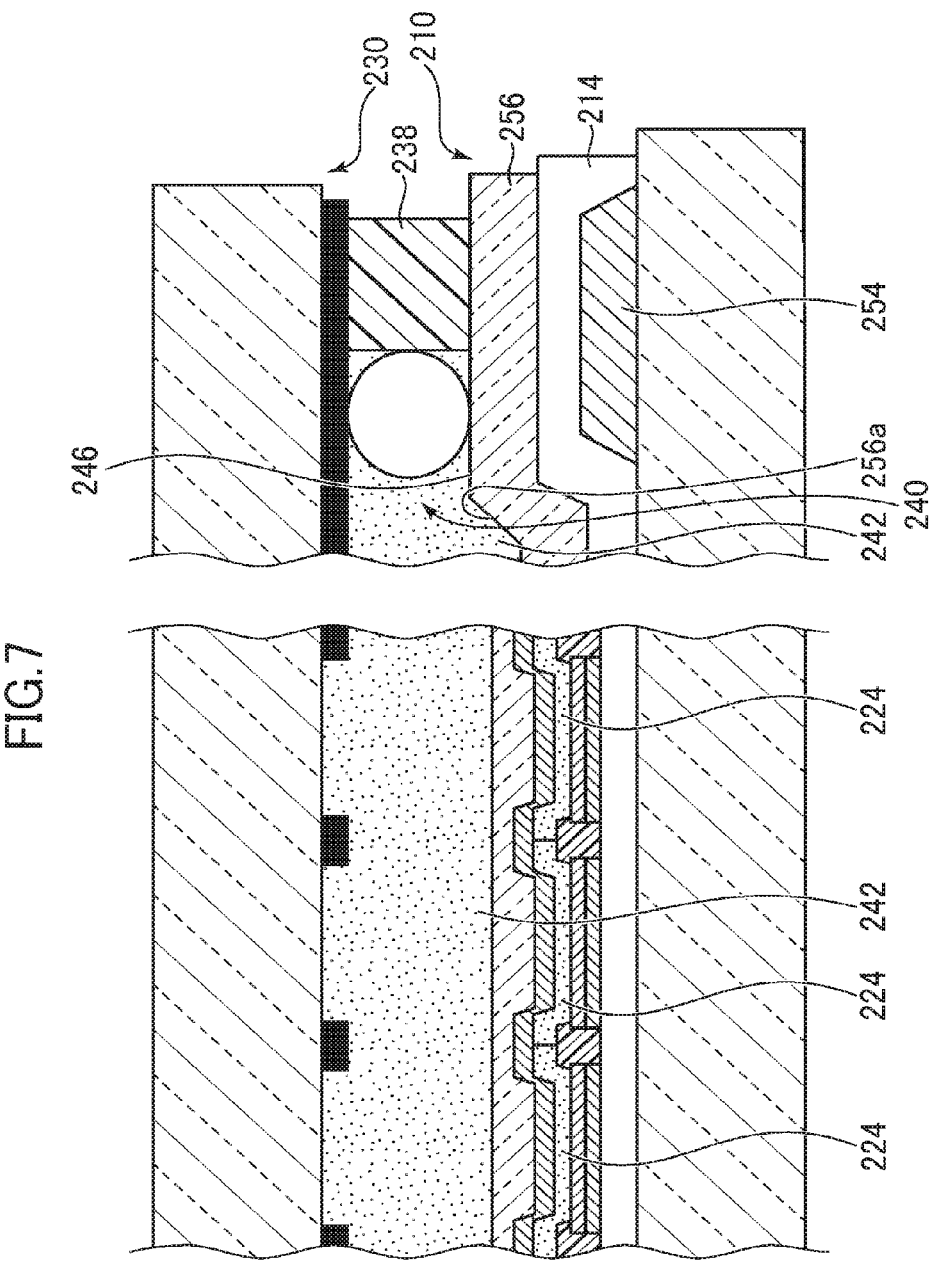
FIG. 7 is a cross-sectional view illustrating a display device according to a second embodiment of the present invention.

FIG. 7 is a cross-sectional view illustrating a display device according to a second embodiment of the present invention. In this example, the color filter layers 36 illustrated in FIG. 1 are not used, but that portion is filled with a filler 242. A plurality of organic electroluminescence layers 224 emits the respective lights of a plurality of colors (for example, red, green, and blue).

A circuit substrate 210 has a metal layer 254. The metal layer 254 is, for example, a wiring. The metal layer 254 is arranged to pass through a position overlapping with a seal 238. An uppermost layer 256 of a circuit layer 214 can be made of the same material as that of the seal film 28 illustrated in FIG. 1, and covers the metal layer 254. The surface of the circuit substrate 210 is irregularly formed due to a difference of the stacked layers. The uppermost layer 256 is arranged to be placed on the metal layer 254 from an area where the metal layer 254 is not present, to thereby form a step 256a in the surface of the uppermost layer 256. A convex surface 246 is formed by the surface of the uppermost layer 256 which rises up so as to configure the step 256a. The convex surface 246 is formed adjacent to a relatively low surface of the surface of the circuit substrate 210. The convex surface 246 is spaced from a counter substrate 230. A space between the convex surface 246 and the counter substrate 230 is a part of a sealed space 240. The details of the other configurations correspond to the contents described in the first embodiment.

Figure 8:
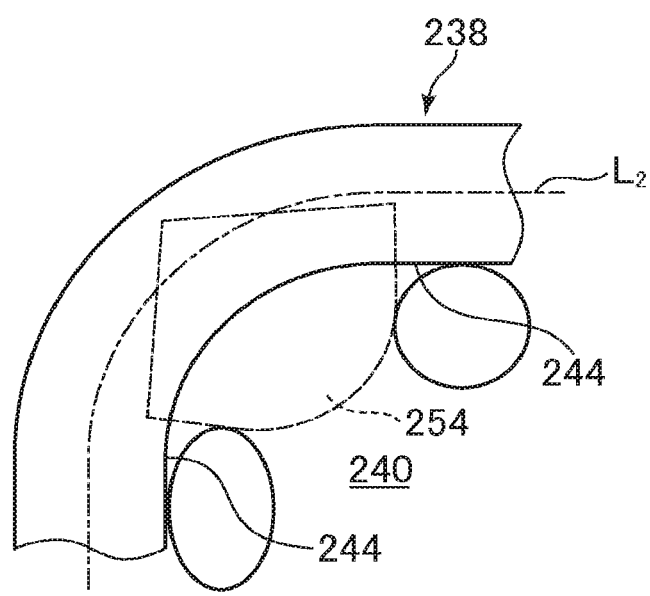
FIG. 8 is a plan view illustrating a corner portion of the seal and a metal layer illustrated in FIG. 7.

FIG. 8 is a plan view illustrating a corner portion of the seal 238 and the metal layer 254 illustrated in FIG. 7. In an inner surface of the seal 238, an internal angle corner surface 244 has a concave curved surface, and in an outer surface of the seal 238, a portion opposite to the corner surface 244 has a convex curved surface. The seal 238 is extended along a line $L_2$ having a start point and an endpoint coincident with each other, and drawn without any interruption and without passing through the same line twice or more. The metal layer 254 includes a portion that overlaps with the seal 238, and a portion (a portion for forming the convex surface 246 illustrated in FIG. 7) protruded from the seal 238 toward the sealed space 240. The portion of the metal layer 254 which is protruded toward the sealed space 240 has a planar shape drawing a convex curve as illustrated in FIG. 8.

Figure 9:
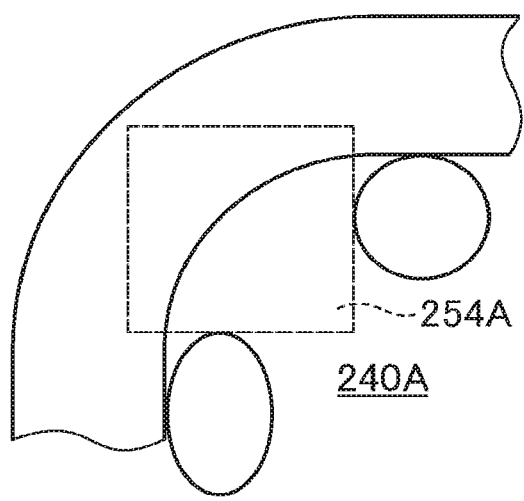
FIG. 9 is a diagram illustrating one modified example of the metal layer illustrated in FIG. 8.

FIG. 9 is a diagram illustrating one modified example of the metal layer 254 illustrated in FIG. 8. In this example, a portion of a metal layer 254A which is protruded toward a sealed space 240A has a planar shape having two sides that sandwich one rectangular angle therebetween.

Figure 10:
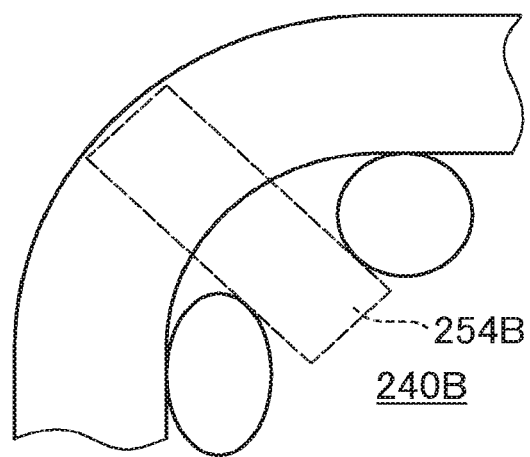
FIG. 10 is a diagram illustrating another modified example of the metal layer illustrated in FIG. 8.

FIG. 10 is a diagram illustrating another modified example of the metal layer 254 illustrated in FIG. 8. In this example, a portion of a metal layer 254B which is protruded toward a sealed space 240B has a planar shape formed by three sides of a rectangle.

Third Embodiment

Figure 11:
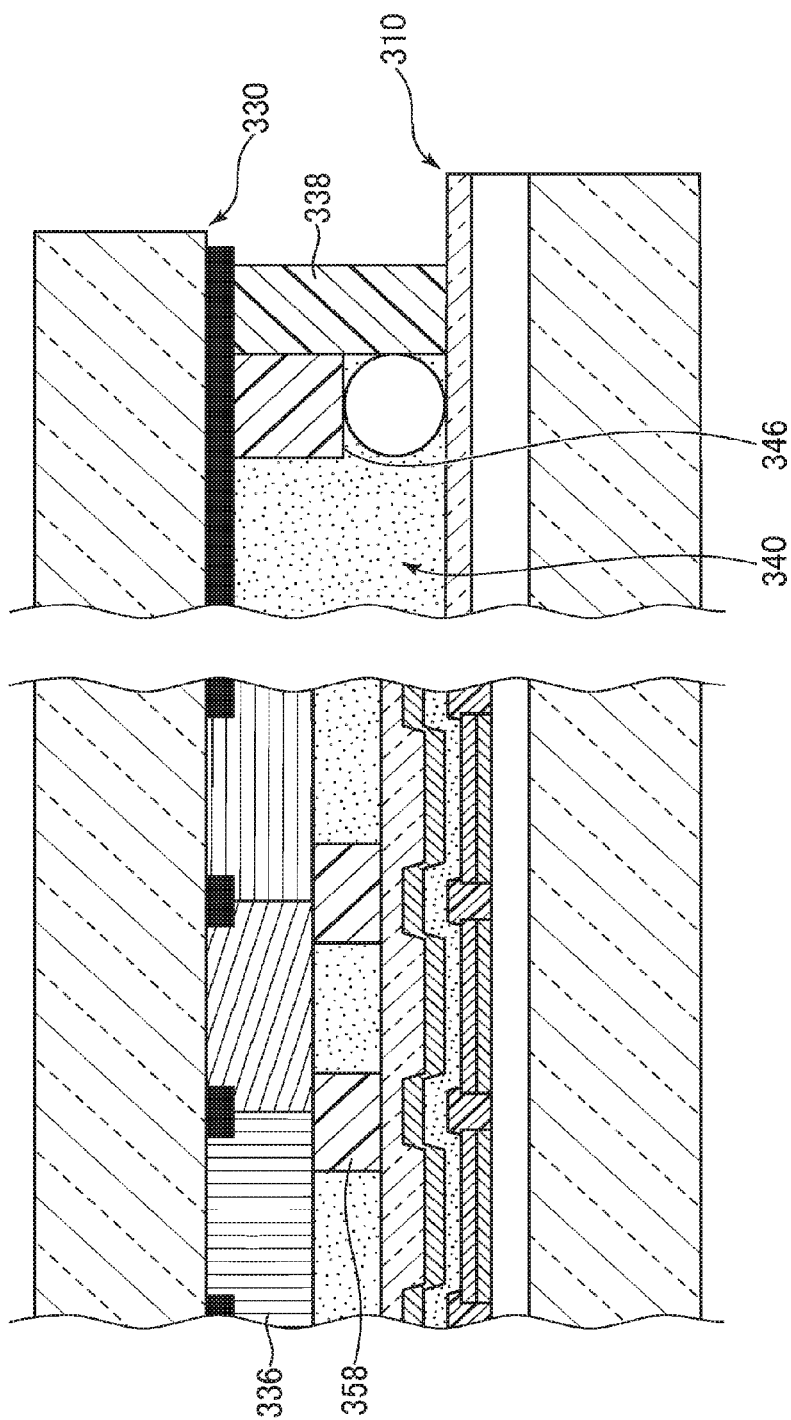
FIG. 11 is a cross-sectional view illustrating a display device according to a third embodiment of the present invention.

FIG. 11 is a cross-sectional view illustrating a display device according to a third embodiment of the present invention. In this example, a counter substrate 330 includes color filter layers 336 arranged with the avoidance of an area inside of a corner surface 344 of a seal 338. The counter substrate 330 includes spacers 358 disposed at positions that overlaps with the color filter layers 336. The spacers 358 allow an interval between a circuit substrate 310 and the counter substrate to be maintained.

A convex surface 346 is formed on the counter substrate. A protrusion portion configuring the convex surface 346 is formed of a layer made of the same material as that of the spacers 358, which is disposed in an area inside of the corner surface 344. The spacers 358 and the layer for forming the convex surface 346 can be formed at the same time. The convex surface 346 formed by the layer made of the same material as that of the spacers 358 is spaced from the circuit substrate 310. A space between the convex surface 346 and the circuit substrate 310 is a part of a sealed space 340. The details of the other configurations correspond to the contents described in the first embodiment.

Figure 12:
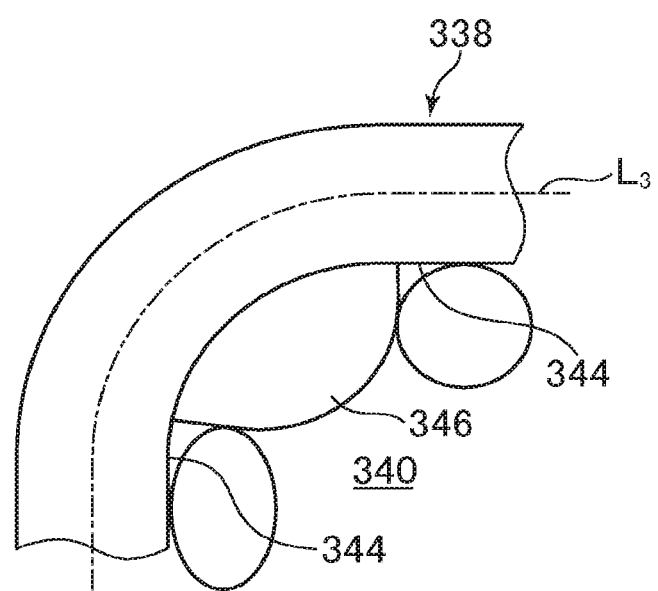
FIG. 12 is a plan view illustrating a corner portion of a seal and a convex surface illustrated in FIG. 11.

FIG. 12 is a plan view illustrating a corner portion of the seal 338 and a convex surface 346 illustrated in FIG. 11. In an inner surface of the seal 338, the internal angle corner surface 344 has a concave curved surface, and in an outer surface of the seal 338, a portion opposite to the corner surface 344 has a convex curved surface. The seal 338 is extended along a line $L_3$ having a start point and an endpoint coincident with each other, and drawn without any interruption and without passing through the same line twice or more. The layer for forming the convex surface 346 comes in close contact with the seal 338, and a leading end surface protruded from the seal 338 has a convex curved surface. The convex surface 346 has a planar shape drawing a convex curve in the portion protruded from the seal 338.

Figure 13:
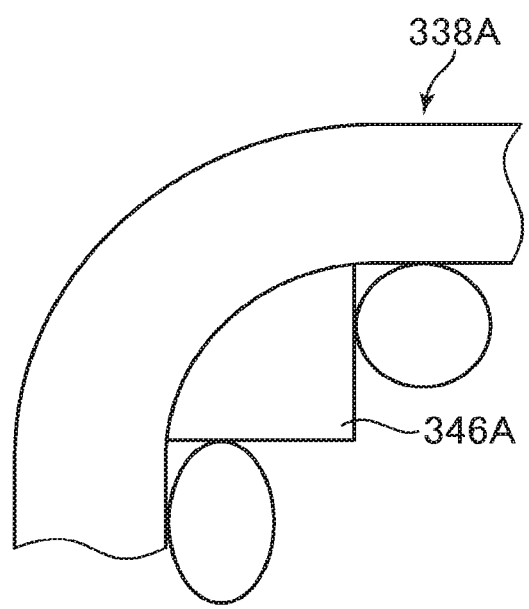
FIG. 13 is a diagram illustrating one modified example of the convex surface illustrated in FIG. 12.

FIG. 13 is a diagram illustrating one modified example of the convex surface 346 illustrated in FIG. 12. In this example, the layer for forming a convex surface 346A comes in close contact with a seal 338A, and a leading end surface protruded from the seal 338A has two surfaces sandwiching one corner portion of side surfaces of a rectangular column therebetween. The convex surface 346A has a planar shape formed of two sides that sandwich one angle of a rectangle therebetween in a portion protruded from the seal 338A.

Figure 14:
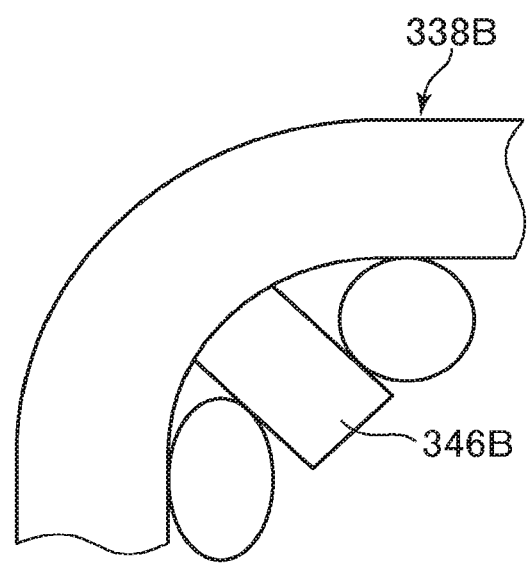
FIG. 14 is a diagram illustrating another modified example of the convex surface illustrated in FIG. 12.

FIG. 14 is a diagram illustrating another modified example of the convex surface 346 illustrated in FIG. 12. The layer for forming a convex surface 346B comes in close contact with a seal 338B, and a leading end surface protruded from the seal 338B has three side surfaces of side surfaces of a rectangular column. The convex surface 346B has a planar shape formed of three sides of a rectangle in a portion protruded from the seal 338B.

While there have been described what are at present considered to be certain embodiments of the invention, it will be understood that various modifications may be made thereto, and it is intended that the appended claims coverall such modifications as fall within the true spirit and scope of the invention.

What is claimed is:

1. A display device comprising:
a circuit substrate including a display area;
a counter substrate facing a surface of the circuit substrate on which the display area is located, with a gap therebetween;
a seal between the circuit substrate and the counter substrate which surrounds the display area, and has an inner surface facing the display area; and
a filler filling a region surrounded by the circuit substrate, the counter substrate and the inner surface of the seal, wherein
the inner surface has a first side and a second side that are adjacent to each other, and has an inner angle between the first side and the second side in plan view as seen in a direction perpendicular to the surface of the circuit substrate, and
the inner angle is smaller than 90 degrees.

2. A display device comprising:
a circuit substrate including a display area; a counter substrate facing a surface of the circuit substrate on which the display area is located, with a gap therebetween; a seal between the circuit substrate and the counter substrate which surrounds the display area, and has an inner surface facing the display area; and a filler filling a region surrounded by the circuit substrate, the counter substrate and the inner surface of the seal, wherein the seal has a protruding portion which protrudes from the inner surface, the inner surface has a first side and a second side that are adjacent to each other, and has an inner angle between the first side and the second side, one of the first side and the second side is along the protruding portion, and the inner angle is equal to or smaller than 90 degrees.

3. The display device according to claim 1, wherein
the seal has a protruding portion which protrudes from the inner surface, and
one of the first side and the second side is along the protruding portion.

4. The display device according to claim 2, wherein
the seal has an outer surface opposite to the inner surface, and
a width between the outer surface and the inner surface including the protruding portion is equal to or greater than another width between the outer surface and the inner surface excluding the protruding portion.

5. The display device according to claim 3, wherein
the seal has an outer surface opposite to the inner surface, and
a width between the outer surface and the inner surface including the protruding portion is equal to or greater than another width between the outer surface and the inner surface excluding the protruding portion.

* * * * *